United States Patent [19]

McElroy

[11] 4,151,021

[45] Apr. 24, 1979

[54] METHOD OF MAKING A HIGH DENSITY FLOATING GATE ELECTRICALLY PROGRAMMABLE ROM

[75] Inventor: David J. McElroy, Houston, Tex.

[73] Assignee: Texas Instruments Incorporated, Dallas, Tex.

[21] Appl. No.: 762,613

[22] Filed: Jan. 26, 1977

[51] Int. Cl.² .................. H01L 21/225; H01L 21/26
[52] U.S. Cl. ................................ 148/187; 148/1.5; 148/188; 148/189; 29/569 L; 29/577 R; 29/577 C; 357/45
[58] Field of Search ............ 148/187, 1.5, 188; 357/45; 29/569 L, 577 R, 577 C

[56] References Cited

U.S. PATENT DOCUMENTS

| | | | |
|---|---|---|---|
| 3,893,152 | 7/1975 | Line | 357/45 X |
| 3,914,855 | 10/1975 | Cheney et al. | 29/571 |
| 3,927,468 | 12/1975 | Anthony et al. | 148/187 X |
| 3,958,323 | 5/1976 | De La Moneda | 148/187 X |
| 4,055,444 | 10/1977 | Rao | 148/1.5 |
| 4,075,045 | 2/1978 | Rideout | 148/187 |

Primary Examiner—G. Ozaki
Attorney, Agent, or Firm—John G. Graham

[57] ABSTRACT

An N-channel, double level polysilicon, MOS read only memory or ROM array is electrically programmable by floating gates which are interposed between the gate oxide and control gates formed by polycrystalline silicon row address lines. The cells may be electrically programmed by applying selected voltages to the source, drain, control gate and substrate. A very dense array is obtained by a simplified manufacturing process which is generally compatible with standard N-channel silicon gate technology. Parallel strips of gate oxide, polycrystalline silicon, and nitride oxidation mask are applied, field oxide is grown, then a perpendicular pattern of strips is etched, removing field oxide as well as parts of the original strips, providing a diffusion mask. The second level polysilicon is then applied as strips overlying the original strips.

14 Claims, 11 Drawing Figures

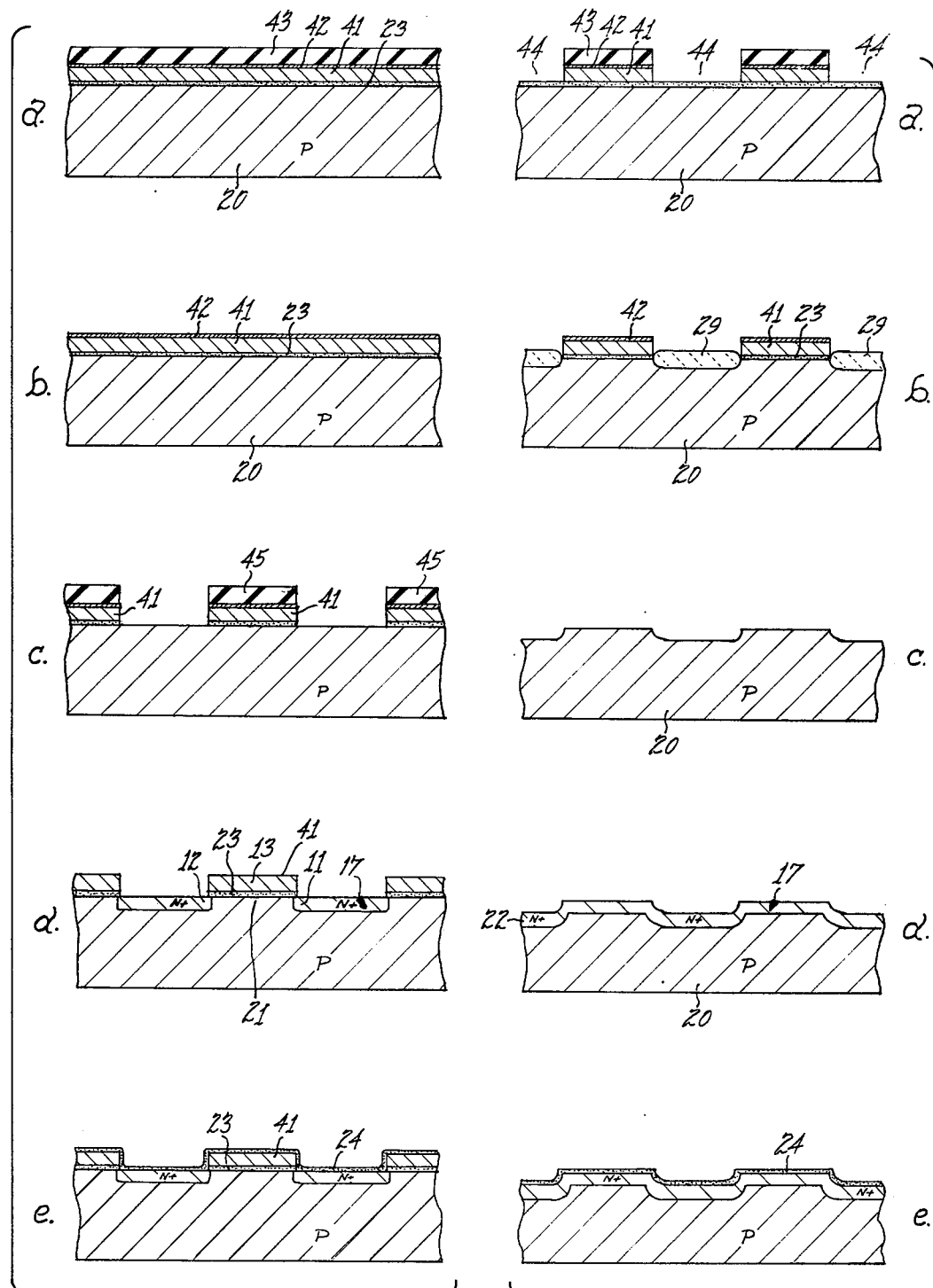

METHOD OF MAKING A HIGH DENSITY FLOATING GATE ELECTRICALLY PROGRAMMABLE ROM

BACKGROUND OF THE INVENTION

This invention relates to semiconductor memory devices and more particularly to an MOS ROM which is electrically programmable.

Semiconductor memory devices which are nonvolatile have great utility in that the information stored is not lost when the power supply is removed. The most common example of a nonvolatile memory is the MOS ROM wherein the stored information is permanently fixed upon manufacture by the gate level mask or moat mask as set forth in U.S. Pat. No. 3,541,543, assigned to Texas Instruments. Most calculators and microprocessor systems employ ROM's of this type to store a program consisting of a large number of instruction words. However, it would be preferable to be able to program the ROM devices after manufacture, so that all devices would be made the same with no unique masks required. Various electrically programmable ROM devices have been developed such as that shown in U.S. Pat. No. 3,984,822 which employs a floating gate in a double level polysilicon MOS ROM; the floating gate is charged by injection of electrons from the channel, and stays charged for years. Other devices of this type have employed charge storage on a nitride-oxide interface. Electrically alterable ROM's have been developed as set forth in U.S. Pat. Nos. 3,881,180, issued Apr. 29, 1975, and 3,882,469, issued May 6, 1975, as well as application Ser. No. 644,982, filed Dec. 29, 1975, now U.S. Pat. No. 4,037,242 all by W. M. Gosney and assigned to Texas Instruments; the Gosney devices are floating gate cells with dual injection (both holes and electrons) so that the gates may be charged or discharged. Other electrically programmable and electrically alterable ROM's are disclosed in copending application Ser. No. 754,144, now U.S. Pat. No. 4,112,509, Ser. No. 754,206, Ser. No. 754,207, now U.S. Pat. No. 4,122,544, and Ser. No. 754,208, now U.S. Pat. No. 4,092,735, all filed Dec. 27, 1976 by Lawrence S. Wall or David J. McElroy and assigned to Texas Instruments. However, the prior cells have exhibited some undesirable characteristic such as large cell size, the process used for manufacture was incompatible with standard techniques, high voltages needed for programming, etc.

It is therefore the principal object of the invention to provide an improved electrically programmable semiconductor memory cell. Another object is to provide an electrically programmable cell which is of small cell size when formed in a semiconductor integrated circuit. A further object is to provide a process for making dense arrays of electrically programmable memory cells compatible with N-channel silicon gate technology.

SUMMARY OF THE INVENTION

In accordance with an embodiment of the invention, a floating gate MOS programmable ROM cell is provided which is made by an N-channel, silicon-gate, self-aligned, double level polysilicon process which is generally compatible with standard processing techniques. The floating gate is formed by the first level polysilicon which is isolated from the second level polysilicon by an insulator. The cells are electrically programmed by applying proper voltages to the sources, drains, and gates. A dense array is obtained by a process wherein parallel strips of gate oxide, first level polysilicon, and silicon nitride are formed by depositing these layers and patterning, then field oxide is grown using the nitride as a mask. A pattern of parallel strips, perpendicular to the first strips, is etched to remove the field oxide and parts of the original strips to produce a diffusion mask. The second level polysilicon is applied after the diffusion to create control gates and row lines.

THE DRAWINGS

The novel features believed characteristic of the invention are set forth in the appended claims. The invention itself, however as well as other features and advantages thereof, may best be understood by reference to the following detailed description of illustrative embodiments, when read in conjunction with the accompanying drawings, wherein:

FIGS. 5a–5e are sectional views corresponding to FIG. 2 or 4a showing a cell according to the invention at various stages of manufacture; and FIGS. 6a–6e are sectional views corresponding to FIG. 4d showing the array at successive stages of manufacture.

DETAILED DESCRIPTION OF SPECIFIC EMBODIMENT

Figure 1:
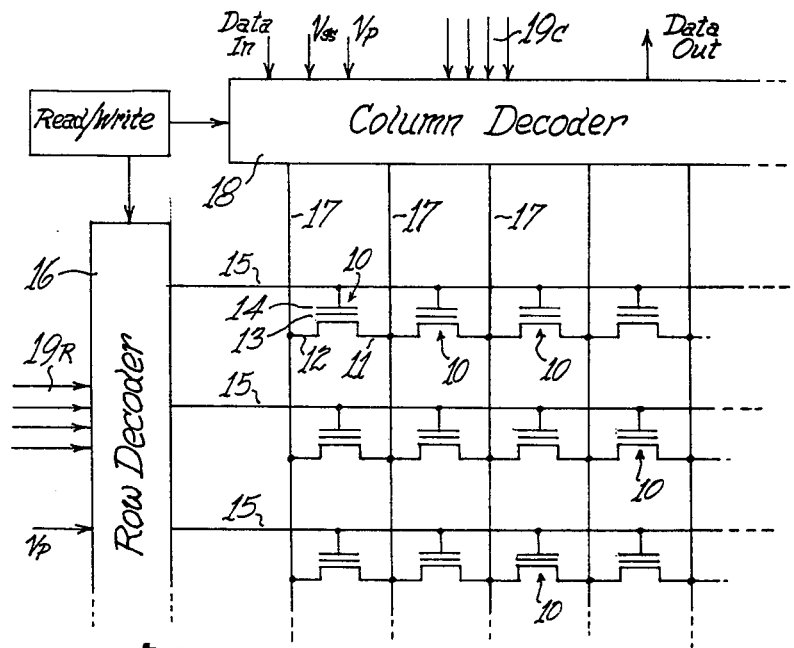
FIG. 1 is an electrical schematic diagram of an array of memory cells according to the invention.

Referring now to FIG. 1, an array of memory cells is shown according to the invention. Each cell is a floating gate transistor 10 having a source 11, a drain 12, a floating gate 13 and a control gate 14. All of the gates 14 in a row of cells are connected to a row address line 15, and all of the row address lines 15 are connected to a row decoder 16. All of the source and drain electrodes 11 or 12 in a column of cells are connected to a column line 17, and the source and drain column lines 17 are connected at each end to a column decoder 18. In a write or program mode, the column decoder functions to apply either a high voltage (about +25 v.) or a low voltage (ground or Vss, or Vbb, depending upon process) selectively to each source and drain column line 17, in response to a column address on lines 19c and a "0" or "1" data input. For write or program operations, the row decoder 16 functions to apply a high voltage Vp or a low voltage Vss or ground to each of the row lines 15 in response to a row address on lines 19R. For read, the column decoder 18 grounds the line 17 to the right of the selected cell and connects a static load to the column line 17 on the left, using a decode arrangement as in FIG. 14 of U.S. Pat. No. 3,988,604, issued Oct. 26, 1976 to J. H. Raymond, assigned to Texas Instruments; the row decoder 16 applies a logic "1" to Vdd voltage to the selected row line 15 and applies a logic "0" or Vss to all other row lines 15.

Figure 2:
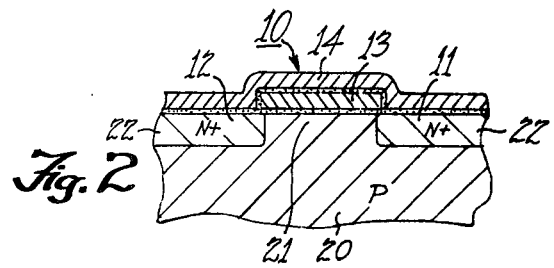
FIG. 2 is an enlarged sectional view of one of the memory cells in the array of FIG. 1.

The structure of one of the cells is seen in a greatly enlarged sectional view in FIG. 2. The cell is formed in a semiconductor substrate 20 which is P-type silicon for the N-channel silicon gate MOS transistors herein described. The transistor 10 of the cell is created by a channel region 21 between N+ type regions 22 which are the source 11 and drain 12. The channel region 21 lies beneath the floating gate 13 which is composed of phosphorus-doped polycrystalline silicon. The floating gate 13 is insulated from the underlying channel region 21 by a gate oxide layer 23 which according to the invention is the original thermally-grown silicon oxide of a thickness of perhaps 700 to 1200 Å, as will be described. The control gate 14 is also composed of phosphorus-doped polycrystalline silicon extending beyond the edges of the floating gate 13 as the row line 15. The control gate 14 is isolated from the floating gate by a thermal oxide layer 24 which may be of selected thickness. Generally, according to copending application Ser. No. 754,144 filed Dec. 27, 1976 by L. S. Wall, assigned to Texas Instruments, the thickness of the oxide layer 24 may be selected, depending upon a number of factors such as process variations, desired operating voltages and conditions, and the like, so that charge escapes from the floating gate 13 when the electric field across the oxide layer 24 is high so the device may be electrically deprogrammed, whereas ordinarily this leakage is an undersirable condition; otherwise the oxide layer 24 is made thicker than the gate oxide 23, for example about 2000 Å. The cell is programmed by holding the source 11 at high voltage, Vp about +25 v. and the drain 12 at Vss while the control gate 14 is at Vp, whereupon the level of current through the channel 21 is such that electrons are injected through the oxide 23 and charge the floating gate 13. Once charged, the floating gate stays in this condition indefinitely, and subsequently the apparent threshold voltage of the transistor is greatly increased, from perhaps +3 to +11 volts. The array is deprogrammed by exposing to ultraviolet light.

Figure 3:
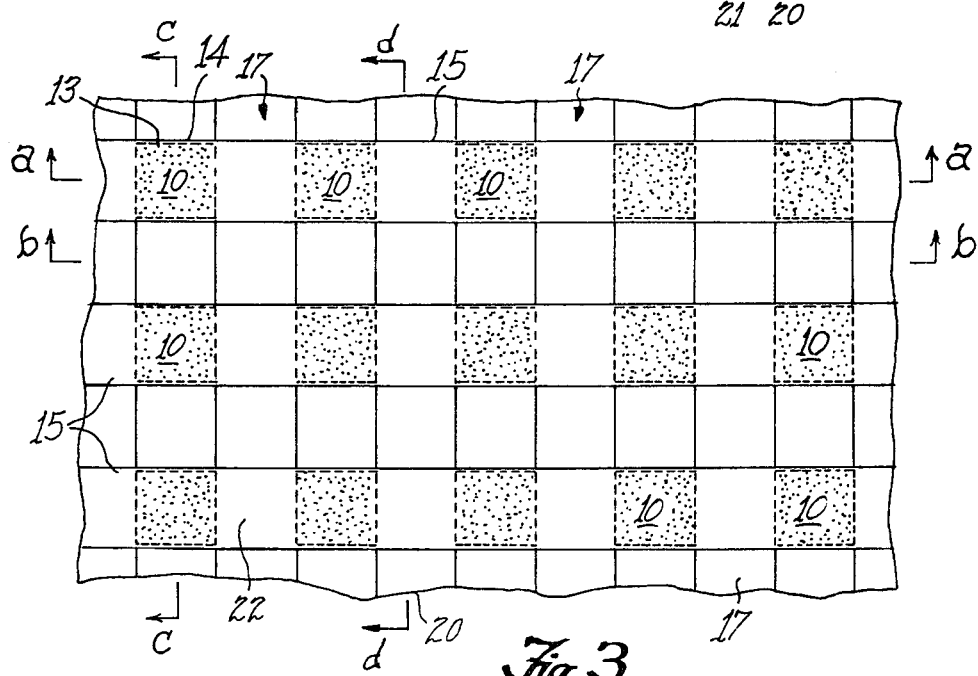
FIG. 3 is a plan view of a part of a semiconductor integrated circuit chip containing an array of the cells of FIGS. 1 and 2.
Figure 4:
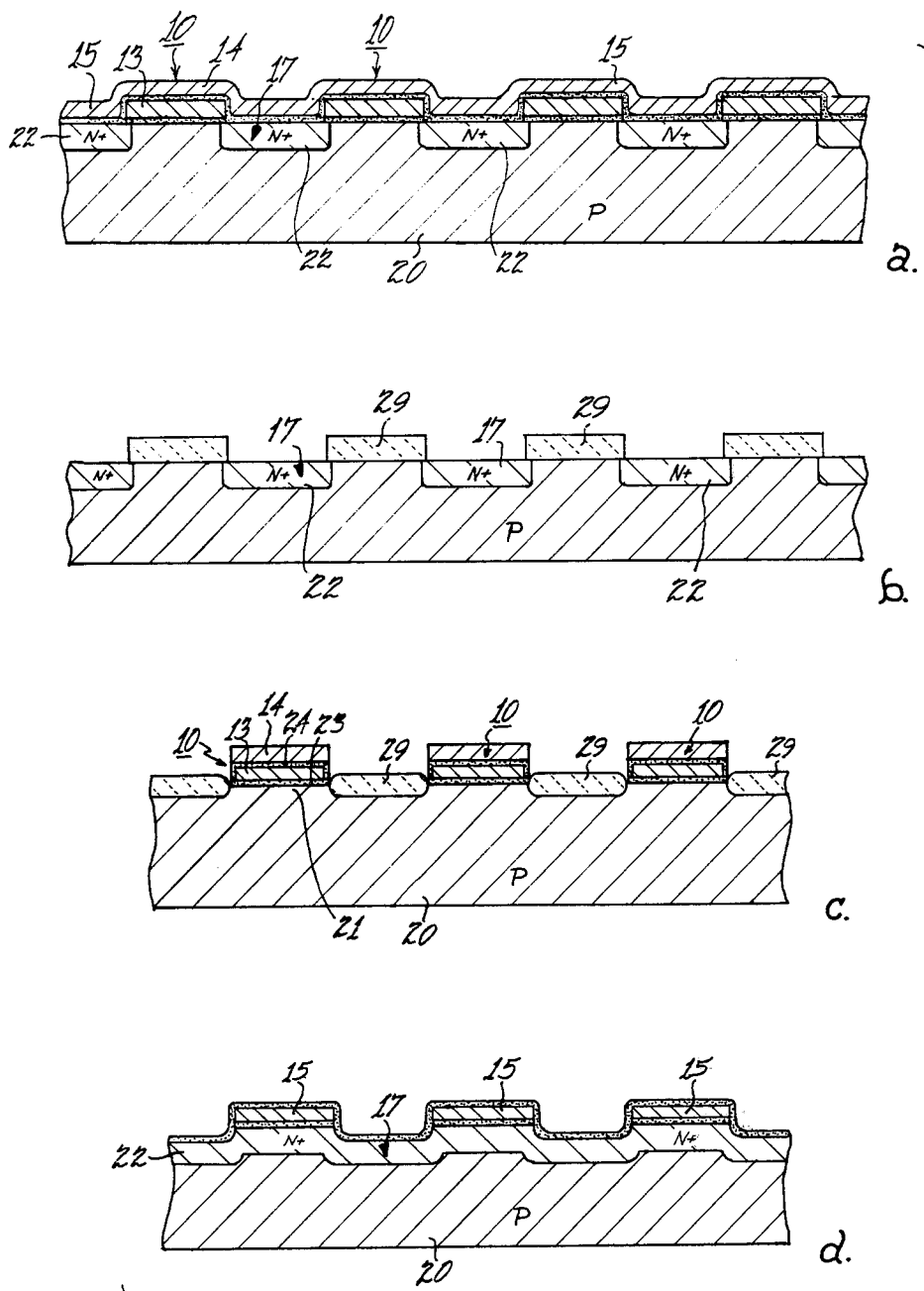
FIGS. 4a–4d are elevation views in section of the array of FIG. 3, taken along the lines a—a, b—b, c—c, and d—d respectively, in FIG. 3.

Referring now to FIG. 3, a part of a cell array according to the invention is illustrated. FIGS. 4a to 4d are sectional views of the device of FIG. 3, as is FIG. 2, showing details of construction. The area shown in FIG. 3 is about 0.6 mils by 1.0 mils in size; the entire cell array may contain for example, 65536 cells ($2^{16}$) or 131072 cells ($2^{17}$), or other power of two. The twelve transistors 10 for the cells shown are created in three parallel elongated areas forming the rows of cells which have thick field oxide 29 on each side. These areas are referred to in the terminology of the industry as "moats;" with the thick field oxide in place the transistors are in depressed areas on the face of the slice, as viewed under a microscope. N+ diffused regions 22 in the moats form interconnections between the cells and the sources and drains of the transistors, creating the rows of cells as well as the column lines 17. Elongated parallel strips of polycrystalline silicon form the address lines 15 and the control gates 14 of the transistors. The floating gates 13 are buried beneath the strips 15. The simplified structure and manufacturing technique of the invention allows the sources, drains, rows and column lines to be formed and interconnected in one diffusion masking operation with a very dense layout.

Turning now to FIGS. 5a–5e and 6a–6e, a process for manufacturing the devices described above will be explained. Note that FIGS. 5a–5e correspond to the sectional view of FIGS. 2 or 4a in the finished device, that is to part of line a—a in FIG. 3, while FIGS. 5a–5e correspond to the sectional view of FIG. 4d, that is to the line d—d in FIG. 3.

This is similar to an N-channel, silicon-gate, double level polysilicon process for making MOS integrated circuit devices except that the first level polysilicon is deposited at the beginning. The starting material is a slice of P-type monocrystalline silicon, perhaps 3 inches in diameter and 30 mils thick, cut on the <100> plane, of P-type conductivity doped with boron in growing to a resistivity of about 6 to 8 ohm-cm. In the FIGURES the wafer or body 20 represents a very small part of the slice, chosen as representative sample cross sections. First, as seen in FIGS. 5a and 6a, after appropriate cleaning, the slice is oxidized by exposing to oxygen in a furnace at an elevated temperature of perhaps 1000° C. to produce an oxide layer 23 of a thickness of about 1000 Å; in contrast to prior methods, this layer 23 remains in the finished device as the gate oxide. Next a layer 41 of polycrystalline silicon is deposited over the entire slice in a reactor using standard techniques, for example by decomposition of silane in hydrogen at about 930° C. to a thickness of about one-half micron, producing the polysilicon which will ultimately form the floating gates 13. The layer of polysilicon is subjected to a phosphorus deposition and diffusion to render it highly conductive. This diffusion does not penetrate the substrate 20 (except perhaps at polysilicon to silicon contact areas on other parts of the slice, not shown). Then a layer 42 of silicon nitride $Si_3N_4$ is formed by exposing to an atmosphere of silane and ammonia in an rf reactor. This nitride layer 42 is grown to a thickness of about 1000 Å. Next, the three-layer sandwich is patterned in a plurality of parallel strips corresponding to the rows. To this end a coating 43 of photoresist is applied to the entire top surface, then exposed to ultraviolet light through a mask which defines the desired pattern, and developed. This leaves areas 44 where nitride is to be etched away, as seen in FIGS. 5a and 6a, these are the areas where field oxide 29 is to be grown. The slice is subjected to an etch sequence, which removes the part of the nitride layer 42 not covered by the photoresist 43, as well as the exposed polysilicon 41 and oxide 23, but does not react with the photoresist 43.

If channel stop regions are needed beneath field oxide, the slice might now be subjected to an ion implant step preferably using another oversized moat mask, whereby boron atoms are implanted in the areas of silicon not covered by photoresist which masks the implant. Boron is an impurity which produces p-type conductivity, so a more heavily doped P+ region would be produced in the surface. The boron implant would be at a dosage of about $4 \times 10^{13}/cm^2$ at 100 KeV. After the implant, the photoresist layer would be removed. These implanted regions, (for simplicity not shown in the drawings), would ultimately produce the P+ channel stop regions. Because of the oversized moat mask, the channel stop regions would not touch the N+ regions or channels, so breakdown problems would be avoided.

The following step in the process is formation of field oxide, which is done by subjecting the slices to steam or an oxidizing atmosphere at about 900° C. for perhaps 10 hours. As seen in FIG. 6b, this causes a thick field oxide region or layer 29 to be grown, and this region extends into the silicon surface because silicon is consumed as it oxidizes. The nitride layer 42 masks oxidation beneath it. The thickness of this layer 29 may be thinner than in standard processing, perhaps about 4000 to about 8000 Å, half of which is above the original surface and half below. The channel stop implant, if performed, will be partly consumed, but will also diffuse further into the silicon ahead of the oxidation front.

Although not reflected in the FIGURES, ion implant steps may be performed to create the desired threshold or operating parameters in transistors in the integrated circuit, either in the cell array or in the peripheral circuits such as decoders, output buffers, input latches and buffers, clock generators and the like. First, boron may be implanted at 50 KeV to a dosage of about $2.5 \times 10^{11}$ atoms/cm$^2$ for the purpose of adjusting the threshold voltage of thin oxide enhancement mode transistors so that substrate bias voltage will not be needed. Then, a photoresist layer may be applied and patterned to expose the channel areas of depletion load transistors in peripheral circuitry. These areas are then subjected to a phosphorus implant at 150 KeV with a dosage of about $1 \times 10^{12}$/cm$^2$. This phosphorus implant is selected to produce a compromise of high speed and low power for devices in the peripheral circuits.

Referring to FIG. 6c, the nitride 42, the polysilicon coating 41 and the underlying gate oxide layer 23 are next patterned in a plurality of parallel strips normal to the rows 15 to create the columns. This is done by applying a layer 45 of photoresist, exposing to ultraviolet light through a mask prepared for this purpose, developing, then etching with the remaining photoresist masking strips on the face of the wafer. The resulting structure is seen in FIGS. 5c and 6c, where parts of the remaining polysilicon layer 41 provide what will be the floating gates 13 of the transistors 10; the field oxide 29 is also removed in strips not covered by the photoresist layer 45, where the N+ diffusion will create the column lines 17.

Referring to FIGS. 5d and 6d, using the remaining field oxide 29 as well as the polysilicon 41 and its underlying thin oxide 23 as a diffusion mask, the slice is now subjected to an N+ diffusion, whereby phosphorus is deposited and then diffused into the silicon slice 20 to produce the column lines 17, the N+ source and drain regions 11 and 12 as well as the regions 22 in the moats. The depth of diffusion is about 8000 Å. The N+ diffused regions function as conductors which connect the various regions together, and also function as the source or drain regions. The nitride 42 is removed and the exposed silicon surfaces are oxidized after the diffusion, providing an oxide coating 24 over the polysilicon 41 and the silicon surface of FIG. 6e. The layer 24 of silicon dioxide is grown on the silicon and polysilicon, producing a coating on all exposed surfaces of the polysilicon, including tops and sides. The layer 24 is grown at about 900° C. in oxygen for about one hour, producing approximately 2000 Å thickness and consuming part of the polysilicon.

As will be seen by referring back to FIGS. 4a and 4d, the second level polycrystalline silicon is next deposited over the entire top surface of the slice over the oxide layer 24, using a reaction as above, then subjected to phosphorus diffusion to render it conductive, providing the control gates 14 and row lines or strips 15. The second level polysilicon is patterned using photoresist to define the strips 15, producing the structure of FIGS. 2 and 4a–4d.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A method of making an electrically programmable floating gate nonvolatile semiconductor memory in the form of an array of rows and columns of memory cells, comprising the steps of: applying successive coatings of oxide, polycrystalline silicon and an oxidation mask to a face of a silicon body; patterning said coatings to provide a plurality of parallel strips; oxidizing the face of the silicon body to produce field oxide in the areas between said parallel strips thicker than the oxide coating; patterning said coatings and the field oxide to provide a second plurality of parallel strips normal to the original parallel strips exposing the face of the silicon body; introducing conductivity-type determining impurity into the exposed silicon at said second plurality of parallel strips to provide column lines; providing an insulating coating over the face; and providing a pattern of parallel strips of polycrystalline silicon overlying the insulating coating and the original parallel strips to provide row lines.

2. A method according to claim 1 wherein the oxidation mask is silicon nitride.

3. A method according to claim 2 wherein the silicon nitride acts as an oxidation mask during the step of oxidizing the face of the silicon body and also during the step of providing an insulating coating which is by thermal oxidation.

4. A method according to claim 2 wherein the step of introducing impurity is a diffusion step, and the impurity is of opposite type from the silicon body.

5. A method according to claim 4 wherein the silicon nitride is removed before the strips of polycrystalline silicon are provided overlying the insulating coating.

6. A method of making a semiconductor device comprising the steps of: applying coatings of insulator material, conductive material, and oxidation mask overlying one another on a face of a semiconductor body; patterning said coatings to provide a first plurality of parallel strips; oxidizing the face of the body to produce thick field oxide in the areas between the first parallel strips; patterning said coatings and the field oxide to expose the face of the semiconductor body in a second plurality of parallel strips perpendicular to the first parallel strips; introducing impurity material into the face in said exposed strips; providing an insulating coating over the face; and providing a pattern of parallel strips of conductive material overlying the insulating material and the first parallel strips.

7. A method according to claim 6 wherein the semiconductor body is silicon, the insulator material is silicon oxide, and the conductive material is heavily-doped polycrystalline silicon.

8. A method according to claim 7 wherein semiconductor body is predominantly P-type and the impurity material produces N-type regions.

9. A method of making a semiconductor memory comprising the steps of:
  (a) applying overlying coatings of thin gate oxide, polycrystalline silicon, and silicon nitride to a face of a wafer of semiconductor material, and masking said face of the wafer to cover a plurality of generally parallel rows of the coatings adjacent one another;
  (b) forming a thick field oxide coating on said face in the areas between the row not covered by masking;

(c) masking said face of the wafer to cover a plurality of generally parallel columns perpendicular to the rows;

(d) etching away the thick field oxide and the coatings in the areas between columns not covered by masking;

(e) introducing impurity into the face of the wafer in the areas exposed by such etching creating heavily-doped regions in the rows in areas between the columns to provide the sources and drains of a plurality of series-connected MOS transistors in each row, the MOS transistors having channel regions between the sources and drains, and at the same time creating lines connecting to sources and drains of adjacent transistors;

(f) coating the face of the wafer with oxide insulator;

(g) applying a plurality of generally parallel rows of polycrystalline silicon over the face above the oxide insulator, the rows being perpendicular to the columns and overlying the rows of coatings.

10. A method according to claim 9, wherein the polycrystalline silicon is heavily-doped to render it conductive, the semiconductor material is p-type silicon, the heavily-doped regions are n-type, and the oxide coating is formed by oxidizing the silicon.

11. A method according to claim 10, wherein the heavily-doped regions are formed by diffusion.

12. A method according to claim 11, wherein the first mentioned coating of polycrystalline silicon provides floating gates and the second mentioned polycrystalline silicon provides the control gates of electrically programmable MOS transistors.

13. A method according to claim 12, wherein the thin gate oxide is much thinner than the thick field oxide.

14. A method of making a semiconductor device comprising the steps of: applying coatings of insulator material, conductive material, and oxidation mask overlying one another on a face of a semiconductor body; patterning said coatings to provide a first plurality of areas; oxidizing the face of the body to produce thick field oxide between the first plurality of areas; patterning said coatings and the field oxide to expose at least part of the face of the semiconductor body in a second plurality of areas; introducing impurity material into said face; providing an insulating coating over the face; and providing a pattern conductive material overlying the insulating material.

* * * * *